(12) United States Patent
Sakairi

(10) Patent No.: US 10,622,413 B2
(45) Date of Patent: Apr. 14, 2020

(54) DISPLAY DEVICE, METHOD OF MANUFACTURING DISPLAY DEVICE, AND ELECTRONIC APPARATUS

(71) Applicant: Sony Corporation, Tokyo (JP)

(72) Inventor: Takashi Sakairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/569,814

(22) PCT Filed: Jun. 1, 2016

(86) PCT No.: PCT/JP2016/066149
§ 371 (c)(1),
(2) Date: Oct. 27, 2017

(87) PCT Pub. No.: WO2016/203946
PCT Pub. Date: Dec. 22, 2016

(65) Prior Publication Data
US 2018/0145113 A1    May 24, 2018

(30) Foreign Application Priority Data
Jun. 16, 2015 (JP) ................................. 2015-121320

(51) Int. Cl.
*H01L 27/32* (2006.01)
*G02F 1/1335* (2006.01)
(Continued)

(52) U.S. Cl.
CPC ............. *H01L 27/322* (2013.01); *G02B 5/20* (2013.01); *G09F 9/30* (2013.01); *H05B 33/12* (2013.01);
(Continued)

(58) Field of Classification Search
CPC ... G02B 5/20; H01L 27/322; G02F 1/133512; G02F 2001/133388; G09G 3/3208
See application file for complete search history.

(56) References Cited

U.S. PATENT DOCUMENTS

2006/0135029 A1* 6/2006 Harada ............... H01L 51/5246
445/25
2007/0030379 A1* 2/2007 Agranov ............. H04N 5/2254
348/340
(Continued)

FOREIGN PATENT DOCUMENTS

JP    01-213079 A    8/1989
JP    11-038426 A    2/1999
(Continued)

*Primary Examiner* — Xuemei Zheng
(74) *Attorney, Agent, or Firm* — Michael Best & Friedrich LLP

(57) ABSTRACT

A display device includes: a plurality of pixels arranged in a two-dimensional fashion, each of the pixels including a light emitting device; and a color filter layer having color filters, the color filters facing the plurality of pixels, each of the color filters corresponding to one of a plurality of colors. Of a plurality of color filters in the color filter layer, color filters disposed in a peripheral section within a display region are shifted from center locations of corresponding pixels, and have smaller thicknesses than thicknesses of color filters disposed in a central section within the display region.

15 Claims, 14 Drawing Sheets

(51) Int. Cl.
  *G02B 5/20* (2006.01)
  *H05B 33/12* (2006.01)
  *G09F 9/30* (2006.01)
  *G09G 3/3208* (2016.01)

(52) U.S. Cl.
  CPC ... *G09G 3/3208* (2013.01); *G09G 2310/0264* (2013.01)

(56) References Cited

U.S. PATENT DOCUMENTS

2010/0141874 A1* 6/2010 Morita .............. G02F 1/133514
  349/106
2017/0005280 A1* 1/2017 Lee .................... H01L 51/0097

FOREIGN PATENT DOCUMENTS

| | | |
|---|---|---|
| JP | 11-095228 A | 4/1999 |
| JP | 2009-104969 A | 5/2009 |
| JP | 2009-164025 A | 7/2009 |
| JP | 2013-152853 A | 8/2013 |
| JP | 2015-103406 A | 6/2015 |
| WO | 2014/141842 A1 | 9/2014 |

* cited by examiner

[ FIG. 1 ]
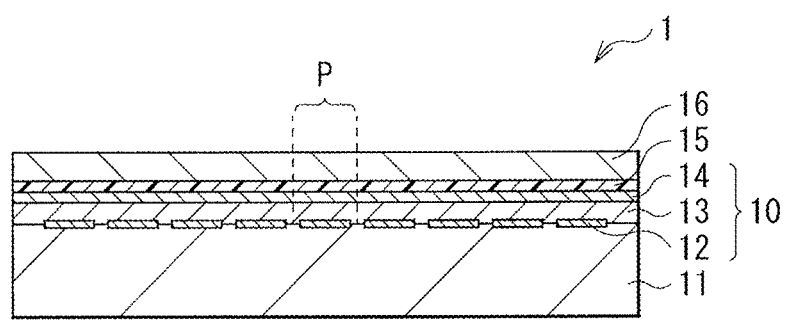
[ FIG. 2 ]
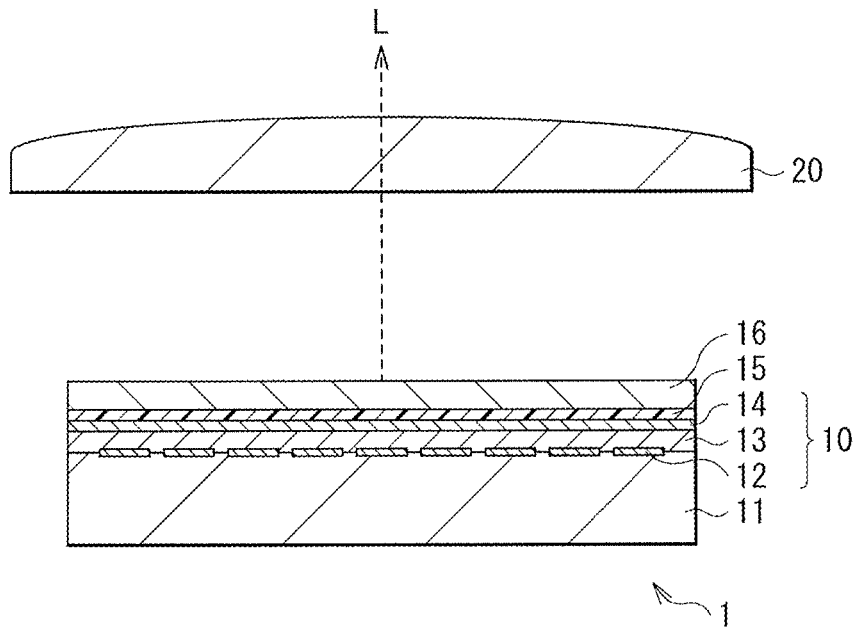

[ FIG. 3 ]
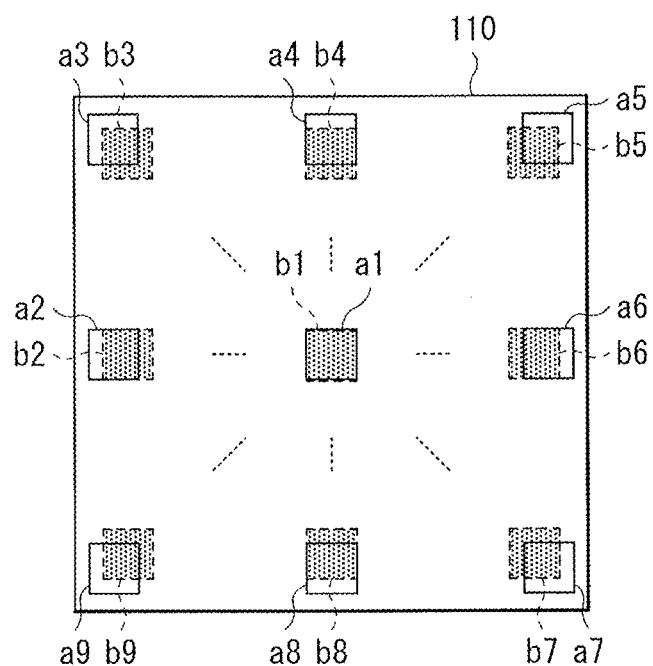
[ FIG. 4A ]
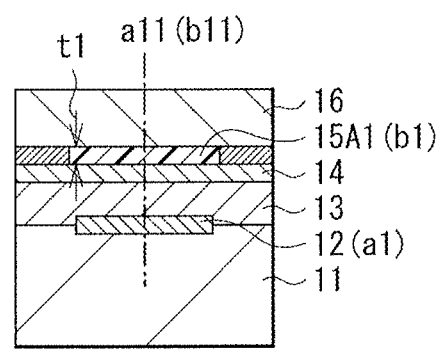
[ FIG. 4B ]
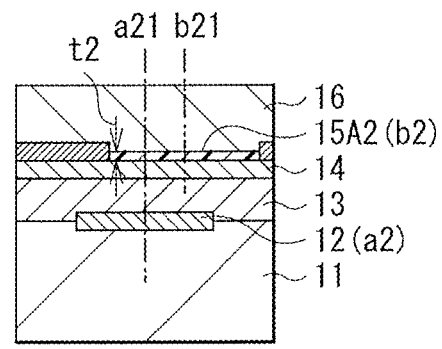

[ FIG. 5 ]
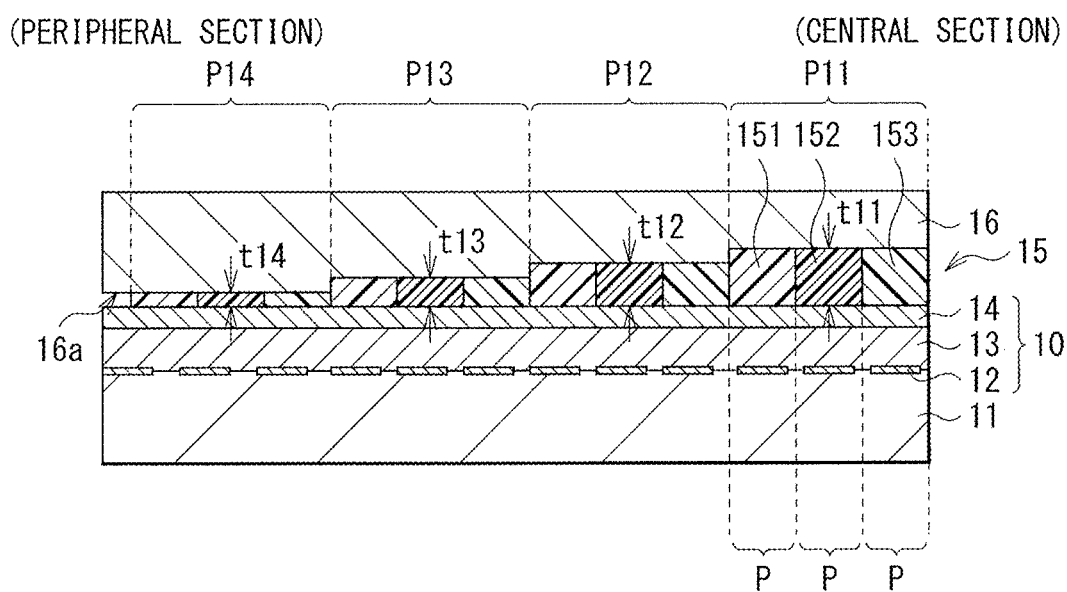
[ FIG. 6 ]
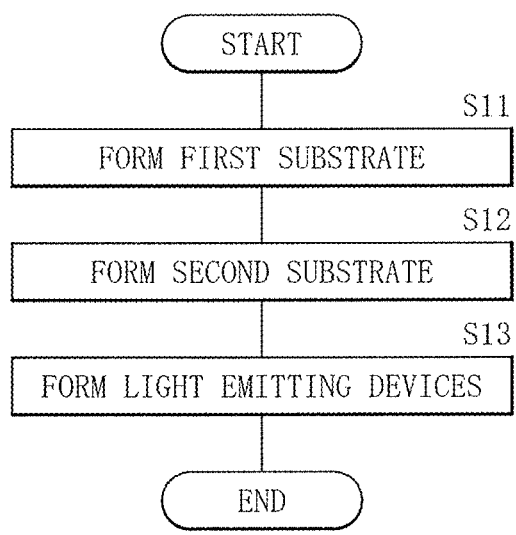

[ FIG. 7A ]
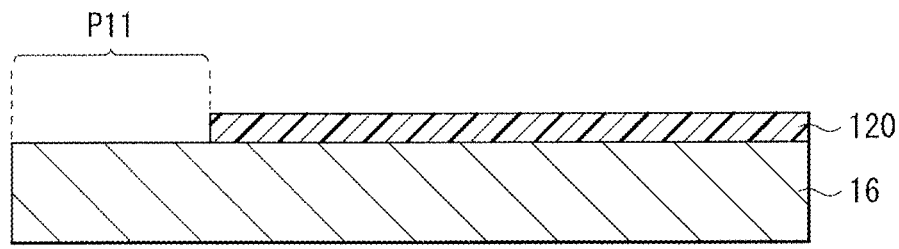
[ FIG. 7B ]
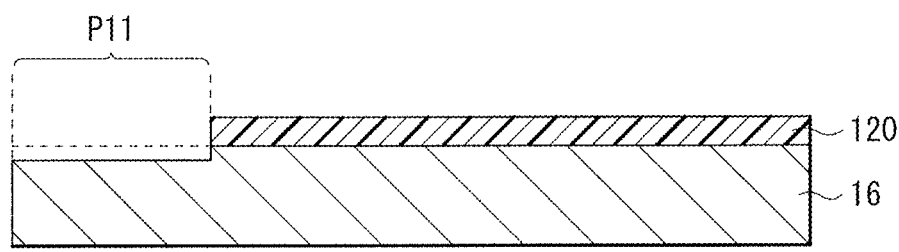
[ FIG. 7C ]
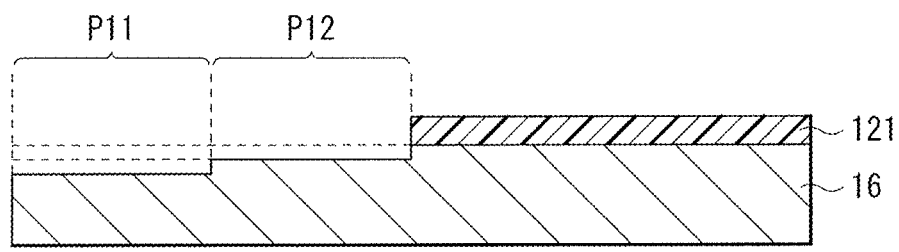
[ FIG. 7D ]
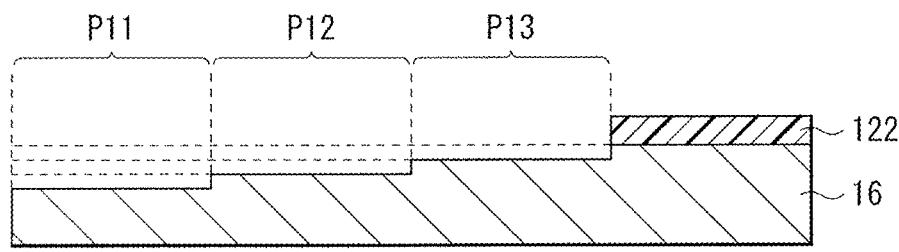

[ FIG. 7E ]
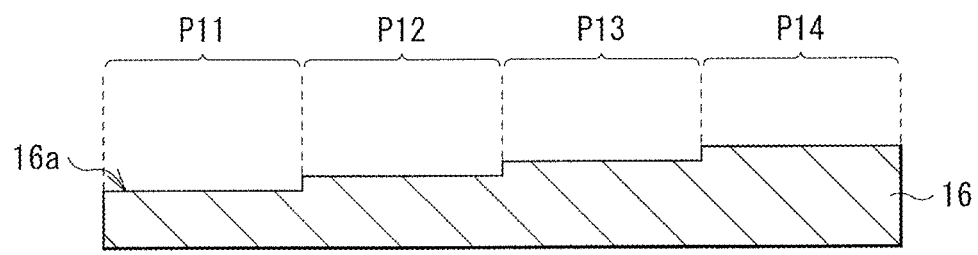
[ FIG. 8A ]
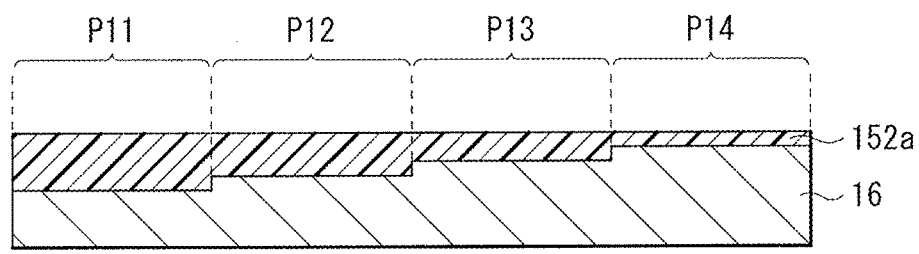
[ FIG. 8B ]
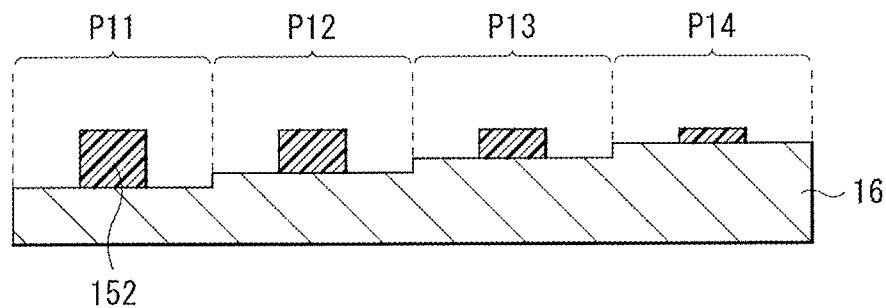

[ FIG. 9A ]
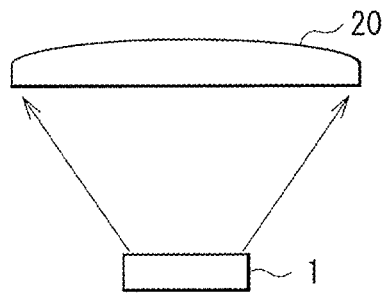
[ FIG. 9B ]
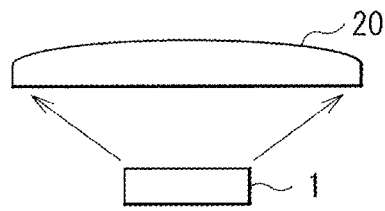
[ FIG. 9C ]
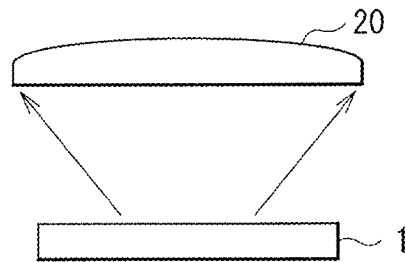
[ FIG. 9D ]
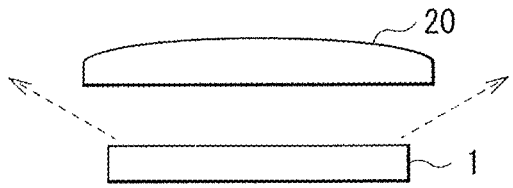

[ FIG. 10 ]
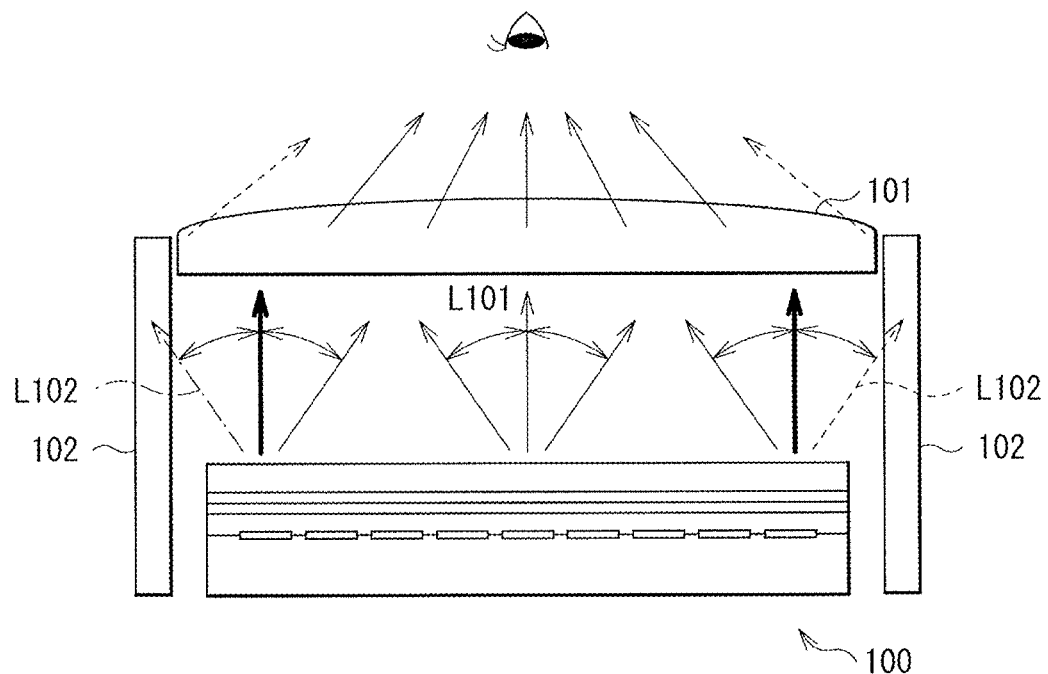
[ FIG. 11 ]
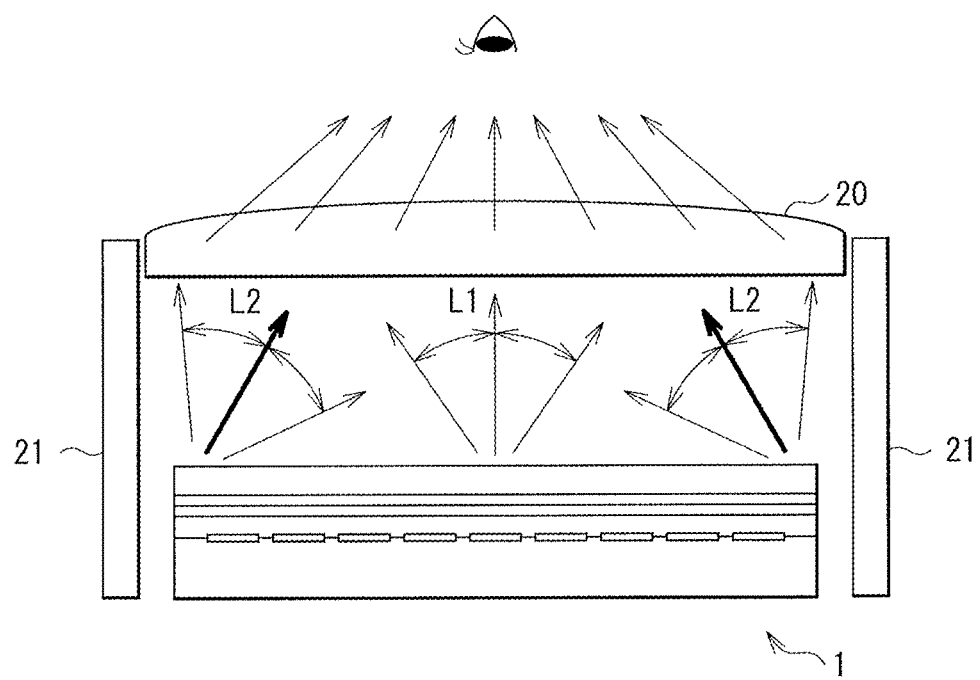

[ FIG. 12A ]
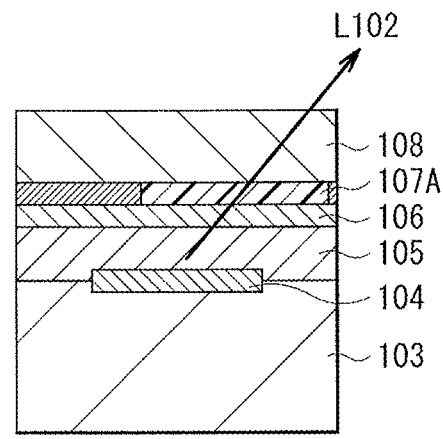
[ FIG. 12B ]
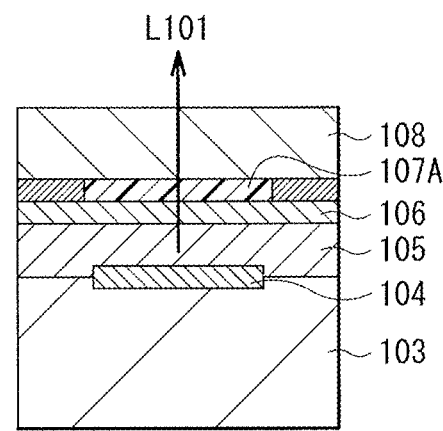

[ FIG. 13 ]
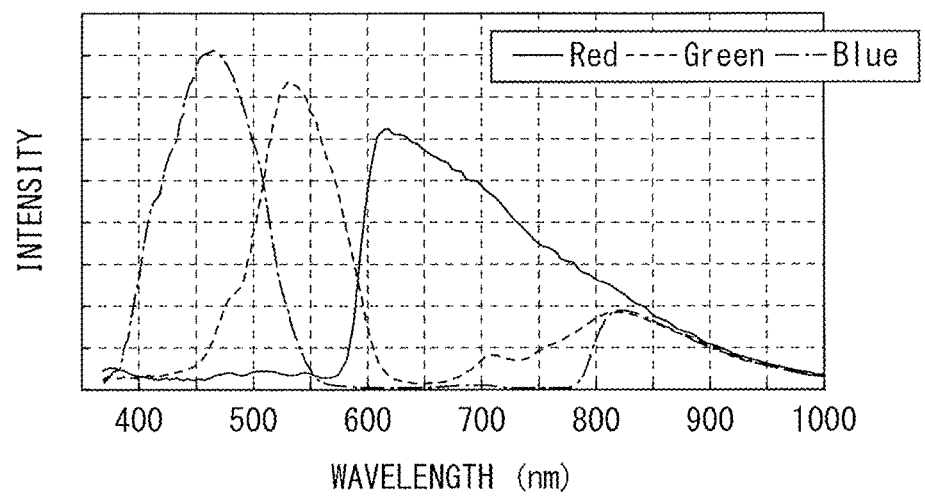
[ FIG. 14 ]
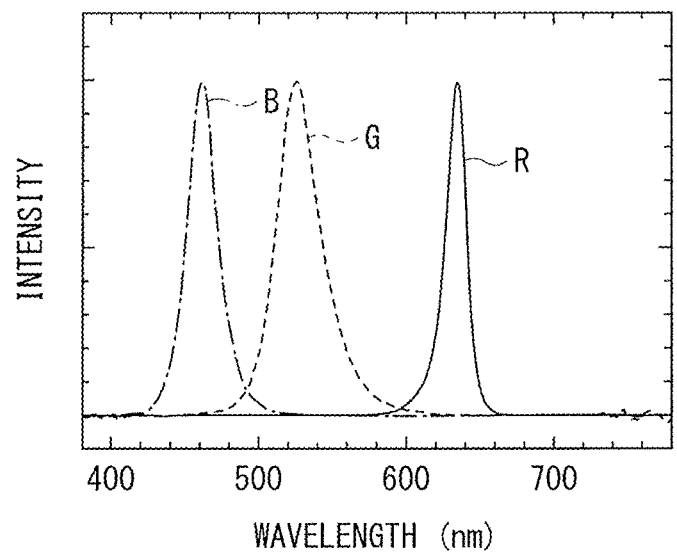

[ FIG. 15A ]
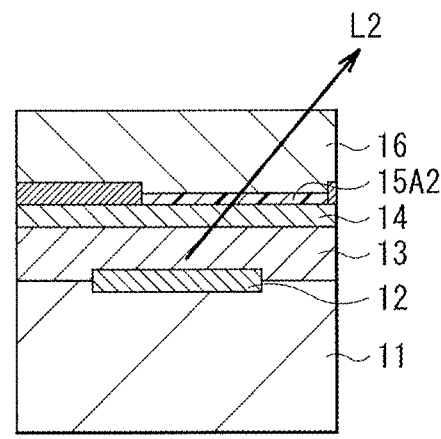
[ FIG. 15B ]
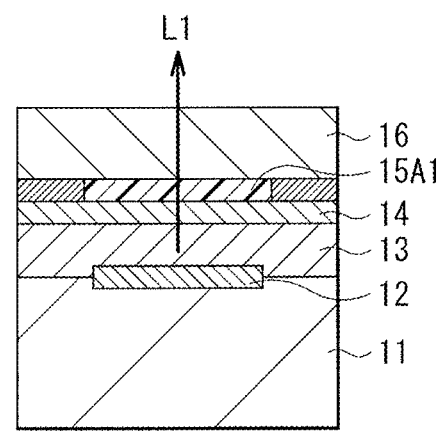

[ FIG. 16 ]
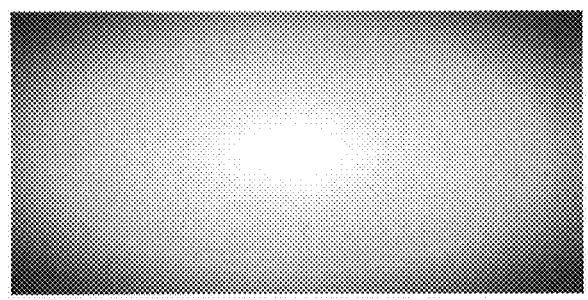
[ FIG. 17 ]
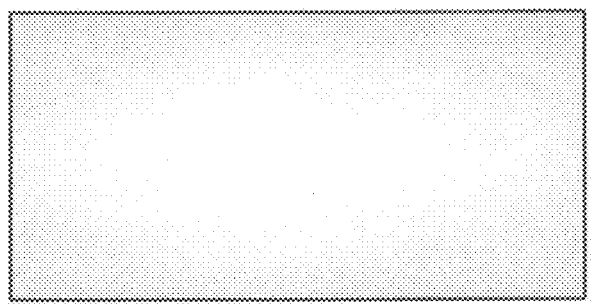

[ FIG. 18A ]
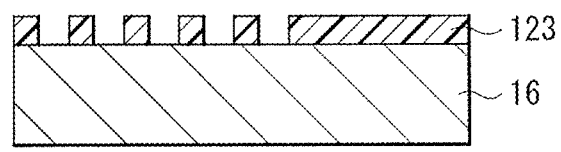
[ FIG. 18B ]
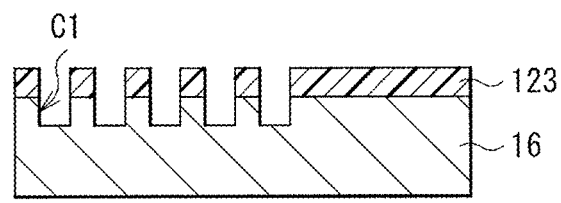
[ FIG. 18C ]
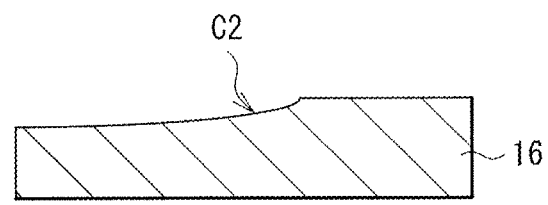
[ FIG. 18D ]
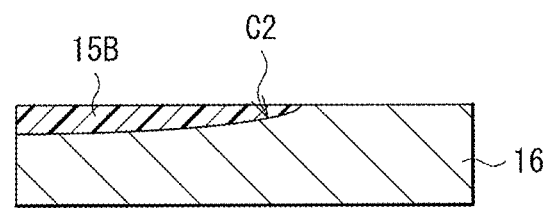

[ FIG. 19 ]
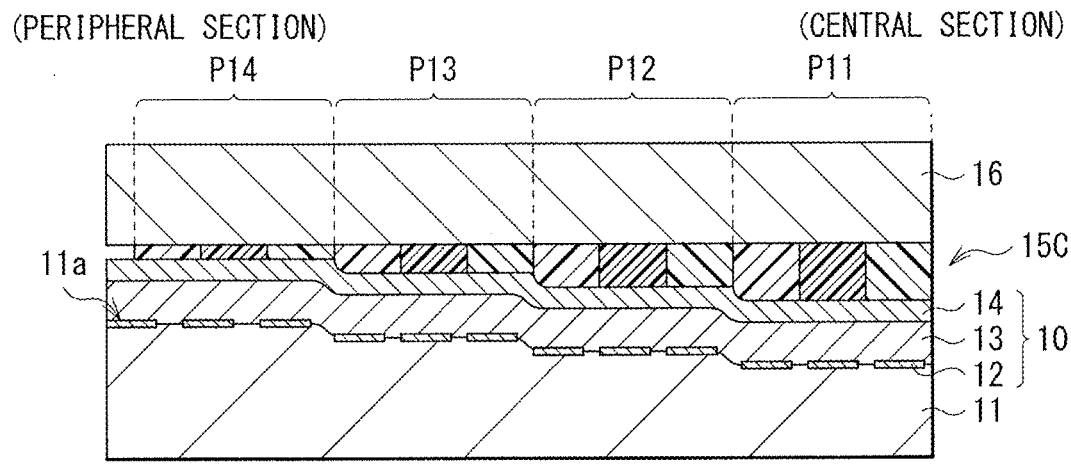
[ FIG. 20 ]
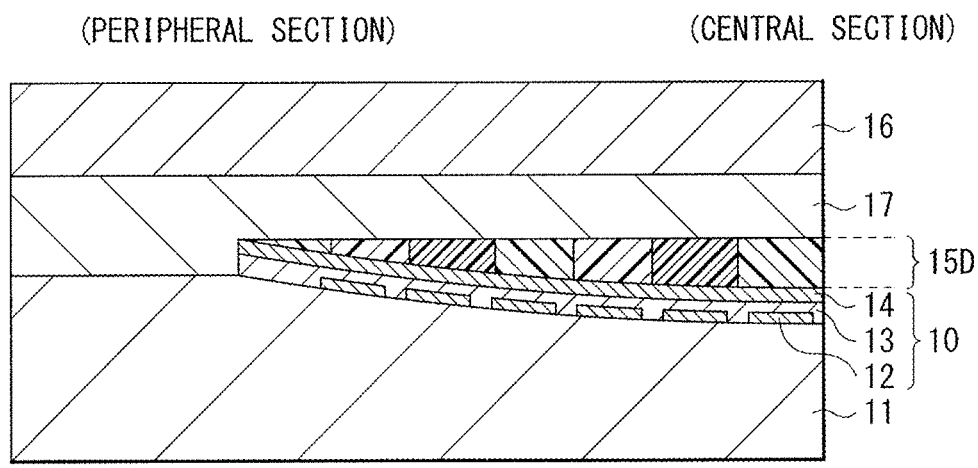

[ FIG. 21 ]
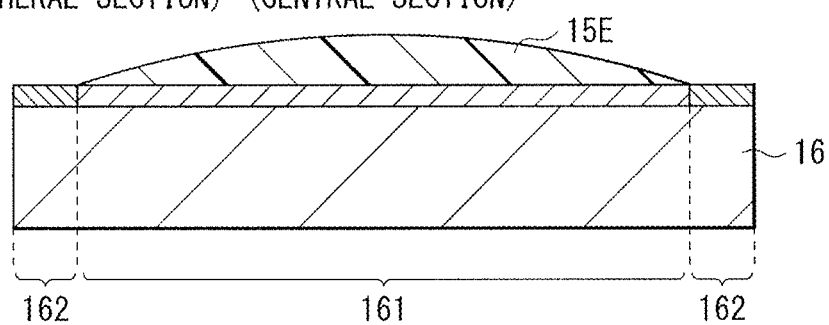

DISPLAY DEVICE, METHOD OF MANUFACTURING DISPLAY DEVICE, AND ELECTRONIC APPARATUS

TECHNICAL FIELD

The present disclosure relates to: a display device suitable for a viewfinder of a camera, a head mount display, or other electronic apparatus; a method of manufacturing a display device; and an electronic apparatus.

BACKGROUND ART

Compact display devices using light emitting devices, such as organic field-effect electro luminescence (EL) devices, have a display surface to be directly viewed through an eyepiece. Accordingly, an eyepiece is made up of a smaller number of constituent elements for a display device having a wider viewing angle (luminance and colors). If a display device has an excessively wide viewing angle, however, light from pixels disposed in a peripheral section within a display region is blocked by a peripheral structure, such as a housing, in which case, the amount of light in the peripheral section within the display region decreases.

The above decrease in the amount of light in the peripheral section decreases may also occur in image sensors used for a camera or other similar apparatuses. In an image sensor, a lens inside a camera main body is so disposed as to be focused on the image sensor. Light having passed through the lens reaches a photodiode through a condenser lens and a color filter provided over the pixels. In this way, the light is detected. While light diagonally enters pixels in a peripheral section on a receiving surface of the image sensor at an acute angle, part of the light may be shaded by a lens barrel. As a result, locations at which the light is focused on the pixels in the peripheral section are displaced outward from center locations of the pixels. Therefore, shifting the locations (center locations) of pixels in the peripheral section on the receiving surface makes it possible for the image sensor to maintain sensitivity thereof. One example of such a technique (so-called pupil correction) that has been proposed for imaging devices, such as image sensors, is described in PTL 1.

CITATION LIST

Patent Literature

[PTL 1] Japanese Unexamined Patent Application Publication No. H01-213079

SUMMARY OF INVENTION

It is, however, difficult to apply the above technique for the pupil correction to display devices without any modifications, because constituent elements of display devices differ from constituent elements of imaging devices. Thus, there is a need to realize a technique for enabling a display device to improve quality of a display image by suppressing a decrease in the amount of light in a peripheral section within its display region.

It is desirable to provide a display device that allows for an improvement in quality of a display image, a method of manufacturing the display device, and an electronic apparatus.

A display device in an embodiment of the present disclosure includes: a plurality of pixels arranged in a two-dimensional fashion, each of the pixels including a light emitting device; and a color filter layer having a plurality of color filters, the color filters facing the plurality of pixels, each of the color filters corresponding to one of a plurality of colors. Of a plurality of color filters in the color filter layer, color filters disposed in a peripheral section within a display region are shifted from center locations of corresponding pixels, and have smaller thicknesses than thicknesses of color filters disposed in a central section within the display region.

A method of manufacturing a display device in an embodiment of the present disclosure includes: forming a plurality of pixels arranged in a two-dimensional fashion, each of the pixels including a light emitting device; and forming a color filter layer having color filters, the color filters facing the plurality of pixels, each of the color filters corresponding to one of a plurality of colors. Of a plurality of color filters in the color filter layer, color filters disposed in a peripheral section within a display region are shifted from center locations of corresponding pixels, and have smaller thicknesses than thicknesses of color filters disposed in a central section within the display region.

An electronic apparatus in an embodiment of the present disclosure includes the above display device according to the embodiment of the present disclosure.

According to the display device, the method of manufacturing the display device, and the electronic apparatus in the embodiments of the present disclosure, the color filters which are disposed in the peripheral section within the display region of the color filter layer are shifted from the center locations of the corresponding pixels. Hence, a light beam emitted from the pixels in the peripheral section is less likely to be shaded by a peripheral structure, thereby suppressing a decrease in the amount of light in the peripheral section. In this case, the thicknesses of the color filters disposed in the peripheral section are smaller than the thicknesses of the color filters disposed in the central section, which decreases a difference in optical path length between light beams passing through the color filters in the peripheral section and light beams passing through the color filters in the central section.

According to the display device, the method of manufacturing the display device, and the electronic apparatus in the embodiments of the present disclosure, the color filters, disposed in the peripheral section within the display region, of the color filter layer are shifted from the center locations of the corresponding pixels. This configuration makes it possible to suppress a decrease in the amount of light in the peripheral section within the display region. Moreover, the thicknesses of the color filters disposed in the peripheral section are smaller than the thicknesses of the color filters disposed in the central section, which makes it possible to decrease a difference in optical path length between light beams passing through the color filters in the peripheral section and light beams passing through the color filters in the central section. This makes it possible to suppress lowering of luminance and a variation in chromaticity, thereby improving quality of a display image.

The above description is an example of the present disclosure. Effects to be achieved by the present disclosure are not limited to effects described above, and may be effects other than those described above, or may further include other effects in addition to those described above.

BRIEF DESCRIPTION OF DRAWINGS

FIG. 1 is a cross-sectional view of a configuration of a display device according to an embodiment of the present disclosure.

FIG. 2 is a cross-sectional view of an example of a usage state of the display device illustrated in FIG. 1.

FIG. 3 is a schematic view used to explain positional shifts of color filters illustrated in FIG. 1.

FIG. 4A is a cross-sectional view used to explain a location and thickness of a color filter for a pixel disposed in a central section.

FIG. 4B is a cross-sectional view used to explain a location and thickness of a color filter for a pixel disposed in a peripheral section.

FIG. 5 is a cross-sectional view of an example of a configuration of a color filter layer.

FIG. 6 is a flowchart of a method of manufacturing the display device.

FIG. 7A is a cross-sectional view used to explain a method of forming the color filter layer illustrated in FIG. 5.

FIG. 7B is a cross-sectional view of a process following a process in FIG. 7A.

FIG. 7C is a cross-sectional view of a process following the process in FIG. 7B.

FIG. 7D is a cross-sectional view of a process following the process in FIG. 7C.

FIG. 7E is a cross-sectional view of a process following the process in FIG. 7D.

FIG. 8A is a cross-sectional view of a process following the process in FIG. 7E.

FIG. 8B is a cross-sectional view of a process following the process in FIG. 8A.

FIG. 9A is a schematic view used to explain relationship among a distance from the display device to an eyepiece, a size of the display device, and a viewing angle of the display device.

FIG. 9B is a schematic view used to explain the relationship among the distance from the display device to the eyepiece, the size of the display device, and the viewing angle of the display device.

FIG. 9C is a schematic view used to explain the relationship among the distance from the display device to the eyepiece, the size of the display device, and the viewing angle of the display device.

FIG. 9D is a schematic view used to explain the relationship among the distance from the display device to the eyepiece, the size of the display device, and the viewing angle of the display device.

FIG. 10 is a schematic view used to explain workings of a display device according to comparative example 1.

FIG. 11 is a schematic view used to explain workings of the display device illustrated in FIG. 1.

FIG. 12A is a schematic view of a light beam emitted from a pixel in a peripheral section in a display device according to comparative example 2.

FIG. 12B is a schematic view of a light beam emitted from a pixel in a central section in the display device according to comparative example 2.

FIG. 13 is a characteristic view of spectral characteristics of a color filter layer used in an imaging device.

FIG. 14 is a characteristic view of spectral characteristics of a color filter layer used in a display device.

FIG. 15A is a schematic view of a light beam emitted from a pixel in the peripheral section in the display device illustrated in FIG. 1.

FIG. 15B is a schematic view of a light beam emitted from a pixel in the central section in the display device illustrated in FIG. 1.

FIG. 16 is a schematic view of an image displayed by the display device according to comparative example 1.

FIG. 17 is a schematic view of an image displayed by the display device illustrated in FIG. 1.

FIG. 18A is a cross-sectional view used to explain a method of forming a color filter layer according to modification 1.

FIG. 18B is a cross-sectional view of a process following a process in FIG. 18A.

FIG. 18C is a cross-sectional view of a process following the process in FIG. 18B.

FIG. 18D is a cross-sectional view of a process following the process in FIG. 18C.

FIG. 19 is a cross-sectional view of a configuration of a color filter layer according to modification 2.

FIG. 20 is a cross-sectional view of a configuration of a color filter layer according to modification 3.

FIG. 21 is a cross-sectional view of a configuration of a color filter layer according to modification 4.

MODES FOR CARRYING OUT THE INVENTION

Some embodiments of the present disclosure will be described below in detail with reference to the accompanying drawings. The description will be given in the following order.
1. Embodiment (an example of a display device having a color filter layer disposed in a peripheral section with its location offset and with a thickness varying in a stepwise manner)
2. Modification 1 (an example of a color filter layer having a continuously varying thickness)
3. Modification 2 (an example in which a recess with a stepwise bottom surface is formed on a first substrate side)
4. Modification 3 (an example in which a recess with a continuously slopping bottom surface is formed on a first substrate side)
5. Modification 4 (an example in which a thickness of a color filter layer is varied by control of wattability)

EMBODIMENT

[Configuration]

FIG. 1 is a cross-sectional view of a configuration of a display device (display device 1) according to an embodiment of the present disclosure. The display device 1 includes, for example an organic EL display device, and is a compact display device to be mounted in an electronic apparatus, such as a viewfinder of a camera or a head mount display. The display device 1 is used in conjunction with an eyepiece 20, for example, as illustrated in FIG. 2 (both the display device 1 and the eyepiece 20 are mounted in an electronic apparatus). This allows a user to view a display light beam L emitted from the display device 1 through the eyepiece 20. The eyepiece 20 is a single lens (lens unit) provided opposite a plurality of pixels P. The eyepiece 20 includes one or more lenses in accordance with the viewing angle characteristic and panel size of the display device 1.

The display device 1 includes a plurality of pixels (subpixels) P arranged in a two-dimensional fashion, such as a matrix fashion, within its display region (effective pixel region). Circuits for driving of the pixels P in an active matrix manner, such as a signal line drive circuit, a scan line drive circuit, and a power line drive circuit, are provided in the vicinity of the display region.

For example, each of the pixels P corresponds to a subpixel for one of three colors, i.e., a red color with a wavelength of 620 nm to 750 nm, a green color with a wavelength of 495 nm to 570 nm, and a blue color with a wavelength of 450 nm to 495 nm. Each of the pixels P includes, for example, a light emitting device 10, such as an organic EL device. The light emitting devices 10 are disposed on a first substrate 11, and each include a first electrode 12, an organic layer 13, and a second electrode 14 in this order from the first substrate 11, for example. A color filter layer 15 and a second substrate 16 are disposed on the second electrode 14 with an unillustrated protective film therebetween.

The first substrate 11 includes a pixel circuit for the pixel P (the light emitting device 10). In the first substrate 11, thin film transistors (TFTs), retention capacity elements, various wires, and other members are provided on a substrate including glass, silicon (Si), or a resin, for example. A surface of the first substrate 11 is covered with a planarizing film (which is not illustrated), for example, and the first electrode 12 is provided on the planarizing film.

For example, the first electrode 12 functions as an anode. The first electrode 12 is provided separately for each of the pixels P, and is electrically coupled to the pixel circuit provided in the first substrate 11. An example of a material for the first electrode 12 is a light-reflective, electrically-conducting film material, and more specific examples thereof is a single substance of one of metallic elements, such as chromium (Cr), gold (Au), platinum (Pt), nickel (Ni), copper (Cu), molybdenum (Mo), tungsten (W), titanium (Ti), tantalum (Ta), and silver (Ag) or an alloy containing one or more of the metallic elements.

An unillustrated organic insulation film (a pixel separation film) is provided on the first electrodes 12 so as to cover the entire display region. Openings are provided in the organic insulation film so as to face the first electrodes 12. Through these openings, the first electrodes 12 are electrically coupled to the organic layer 13.

The organic layer 13 includes a light emitting layer (an organic electroluminescence layer). In this case, the organic layer 13 includes a white-light-emitting layer shared by the pixels P. Note that in addition to the light-emitting layer, the organic layer 13 may include a hole transport layer (HTL), a hole injection layer (HIL), and an electron transport layer (ETL), for example. In addition, an electron injection layer (EIL), such as lithium fluoride (LiF), may be provided between the organic layer 13 and the second electrode 14.

The second electrode 14 functions as cathodes, for example. The second electrode 14 has light transparency, and is provided as an electrode shared by the pixels P. The second electrode 14 may include a transparent, conductive film including indium tin oxide (ITO), indium zinc oxide (IZO), or zinc oxide (ZnO), for example.

The color filter layer 15 has color filters in relation to the respective pixels P. Each of the color filters corresponds to one of a plurality of colors, such as red (R), green (G), and blue (B). The color filter layer 15 has a black matrix (a light-shielding layer) provided in regions between adjacent color filters (regions between adjacent pixels). In this embodiment, some color filters of the color filter layer 15 that are disposed in a peripheral section within the display region are shifted (or offset). Desirably, the locations of the color filters are offset with their shift amounts gradually increasing from a central section to the peripheral section.

FIG. 3 schematically illustrates a planar configuration of the color filters. In FIG. 3, each of a1 to a9 denote the first electrode 12 for each of the pixels P, and each of b1 to b9 denotes the color filter disposed in each of the pixels P. FIG. 4A illustrates a cross-sectional configuration of the pixel P disposed in the central section within a display region 110.

FIG. 4B illustrates a cross-sectional configuration of the pixel P disposed in the peripheral section within the display region 110. In the following description, a center location of the first electrode 12 is regarded as a center location of the pixel P.

As for the pixel P disposed in the central section within the display region 110, the first electrode 12 (a1) squarely faces the color filter 15A1 (b1). More specifically, a center location a11 of the pixel P (the first electrode a1) is aligned with a center location b11 of the color filter 15A1 (b1).

As for the pixel P disposed in the peripheral section, the first electrode 12 (a2) does not squarely face the color filter 15A2 (b2). Thus, a center location a21 of the pixel P (the first electrode a2) is not aligned with a center location b21 of the color filter 15A2 (b2). In other words, the color filter 15A2 (b2) is shifted from the center location of the pixel P. Specifically, in the pixel P, the color filter 15A2 (b2) is displaced toward the central section of the display region (the first electrode a2 is displaced toward the peripheral section).

In this embodiment, the color filters of the color filter layer 15 have different thicknesses within a plane. Specifically, the color filter 15A2 (b2) disposed in the peripheral section within the display region has a smaller thickness than that of the color filter 15A1 (b1) disposed in the central section. In a manner similar to the color filter b2, each of the other color filters b3 to b9 disposed in the peripheral section is shifted from the center location of corresponding one of the pixels P, and has a smaller thickness than that of the color filter b1 in the central section.

Moreover, the color filter layer 15 is configured such that shift amounts of the color filters from the center locations of the corresponding pixels P increase and thicknesses of the color filters decrease with increasing distance from the central section. For example, the thicknesses of the color filters may vary in a stepwise or gradual manner from the central section toward the peripheral section in the display region.

FIG. 5 illustrates an example of the above color filter layer 15. In this embodiment, for example, the thicknesses of the color filters decrease in a stepwise manner from the central section toward the peripheral section, as illustrated in FIG. 5. In this example, the color filters of pixel groups P11, P12, P13, and P14, each of which includes three R, G, and B pixels P as a single group, have different thicknesses. Color filters 151, 152, and 153 in the pixel group P11 disposed in the central section have the greatest thickness, as indicated by t11. The thicknesses of the color filters 151, 152, and 153 (of the pixel groups P12, P13, and P14) gradually decrease toward the peripheral section (t11>t12>t13>t14). Note that in this case, the thicknesses of the color filters vary in units of pixel groups each including three pixels P. However, the thicknesses of the color filters may vary in units of pixel groups each including two or four pixels P or may vary on a pixel P basis.

The color filter layer 15 is formed using a recess (step height) 16a provided, for example on a surface on side on which the light emitting devices 10 are located of the second substrate 16. The recess 16a has a depth varying in a stepwise manner. A surface on side on which the second substrate 16 is located of the color filter layer 15 conforms to a shape of the recess 16a in the second substrate 16. A surface on side on which the light emitting devices 10 are located of the color filter layer 15 has a substantially flat shape. A method of forming the color filter layer 15 will be described later.

The second substrate 16 includes glass, silicon, or a resin, for example. In this embodiment, the surface on side on which the light emitting devices 10 are located of the second substrate 16 is processed. For example, the recess 16a (step height) having a depth varying in a stepwise manner is formed in the surface on side on which the light emitting devices 10 are located of the second substrate 16.

[Manufacturing Method]

The above display device 1 is manufacturable as follows, for example. FIG. 6 illustrates a flow of the method of manufacturing the display device 1. As illustrated in FIG. 6, the first substrate 11 is formed (step S11), and thereafter, the second substrate 16 is formed (step S12). A process of forming the first substrate 11 and a process of forming the second substrate 16 may be performed at the same time or in the opposite sequence. The light emitting devices 10 are formed on the first substrate 11 (step S13), and then the light emitting devices 10 are bonded to the second substrate 16. Thus, the display device 1 is completed.

In a case where the color filter layer 15 illustrated in FIG. 5 is formed, in the step S12, the second substrate 16 is formed as follows, for example. As illustrated in FIG. 7A, first, a photoresist film 120 is formed over a surface of the second substrate 16 including the above-described material, and an opening is formed in a region corresponding to the pixel group P11. Thereafter, as illustrated in FIG. 7B, etching is performed using the photoresist film 120 as a mask, and then, the photoresist film 120 is removed. Subsequently, as illustrated in FIG. 7C, a photoresist film 121 is formed on the second substrate 16, and openings are formed in the regions corresponding to the pixel groups P11 and P12. Thereafter, etching is performed using the photoresist film 121 as a mask. After the etching, the photoresist film 121 is removed. Similarly, as illustrated in FIG. 7D, a photoresist film 122 is formed on the second substrate 16, and openings are formed in the regions corresponding to the pixel groups P11, P12, and P13. Thereafter, etching is performed using the photoresist film 122 as a mask. Thus, the etching is performed a plurality of times to form the recess 16a in a stepwise fashion, as illustrated in FIG. 7E.

Next, the surface in which the recess 16a is formed of the second substrate 16 is coated with a color filter material (a material for a green color filter) 152a, as illustrated in FIG. 8A. The color filter material 152a is thereby formed and embedded in the second substrate 16 so as to planarize the recess 16a. Thereafter, as illustrated in FIG. 8B, patterning the formed color filter material makes it possible to form color filters 152 having different thicknesses in the pixel groups P11 to P14. The other color filters 151 and 153 are formed in a similar manner. Consequently, it is possible to form the color filter layer 15 as illustrated in FIG. 5.

[Workings and Effects]

In the display device 1 in this embodiment, upon application of a drive current to the organic layer 13 through the first electrodes 12 and the second electrode 14 in the light emitting devices 10, the organic layer 13 emits a light beam. The emitted light beam passes through the color filter layer 15 to be turned to one of R, G, and B color light beams, and then is outputted toward upper side of the second substrate 16. In this way, an image is displayed by the display device 1.

An image displayed by the display device 1 in this embodiment is directly viewed through the eyepiece 20, for example, as illustrated in FIG. 9A. Accordingly, as illustrated in FIG. 9B, the wider the viewing angle of the display device 1 is, the smaller the number of constituent elements becomes in the eyepiece. However, in a case where a panel size of the display device 1 increases relative to the eyepiece 20 as illustrated in FIG. 9C, a distance between the eyepiece 20 and the display device 1 also increases, in which case, downsizing is difficult. Nevertheless, increasing the viewing angle makes it is possible to decrease the distance between the eyepiece 20 and the display device 1, thereby achieving downsizing (or thinning), as illustrated in FIG. 9D.

Unfortunately, in a case where the viewing angle increases relative to the eyepiece 20, the following disadvantage arises. FIG. 10 schematically illustrates a display device 100 according to comparative example 1 together with an eyepiece 101. As illustrated in this drawing, a light beam L101 emitted from a pixel disposed in a central section within a display region enters the eyepiece 101. However, part (a light beam L102) of a light beam emitted from a pixel disposed in a peripheral section is blocked by a peripheral structure 102, such as a housing (that is, the part of the light beam does not enter an eyepiece 102. This may decrease the amount of light in the peripheral section within the display region.

In this embodiment, in contrast, color filters of the color filter layer 15 which are disposed in the peripheral section within the display region are shifted from the center locations of the corresponding pixels P. Specifically, the color filters are shifted toward the central section, and their shift amounts increase with increasing distance from the central section. Hence, a light beam L2 emitted from a pixel disposed in the peripheral section is less likely to be shaded by the peripheral structure 21, thereby causing the light beam L2 to enter the eyepiece 20 as with a light beam L1 emitted from the pixel P disposed in the central section enters the eyepiece 20. Consequently, it is possible to suppress a decrease in the amount of light in the peripheral section within the display region.

However, in a case where locations of color filters in the peripheral section within the display region are shifted, the following disadvantage arises. FIG. 12A illustrates a light beam emitted from a pixel disposed in a peripheral section in a display device according to comparative example 2. FIG. 12B illustrates a light beam emitted from a pixel disposed in a central section in the display device according to comparative example 2. In the display device according to comparative example 2, a first electrode 104, an organic layer 105, and a second electrode 106 are disposed in this order on a first substrate 103. A second substrate 108 is disposed on the second electrode 106 with a color filter 107A therebetween. In a case where the location of the color filter 107A in the peripheral section is shifted in this configuration, an optical path length of a light beam L102 (illustrated in FIG. 12A) passing (transmitting) through the color filter 107A in the peripheral section is longer than an optical path length of a light beam L101 (illustrated in FIG. 12B) passing through the color filter 107A in the central section. Specifically, the light beam L101 passes through the color filter 107A in the central section along a vertical direction, whereas the light beam L102 passes through the color filter 107A in the peripheral section along a diagonal direction. For this reason, the optical path length of the light beam passing through the color filter in the central section differs from the optical path length of the light beam passing through the color filter in the peripheral section.

Here, the display device is more likely to cause lowering of luminance and a variation in a chromaticity point that are attributed to characteristics of a color filter than an imaging device used for an image sensor, etc. One reason for this is as follows. In order for the imaging device to identify which color a focused light beam has, the spectral characteristics of color filters exhibit broad transmission widths, and their bands overlap one another, as illustrated in FIG. 13. Therefore, in a case where a pupil correction is performed in the imaging device, even if a location of an on-chip lens (OCL) or an on-chip color filter (OCCF) is adjusted, it is possible for the imaging device to cope with the characteristics of color filters. In display devices, however, it is preferable that light beams outputted from color filters have wavelengths close to chromaticity points of R, G and B colors, and have as narrow wavelength bands as possible, as illustrated in FIG. 14. Thus, light traveling through color filters in the display device is attenuated in proportion to its travel distance. In short, the display device causes variations in chromaticity points and luminance in a case where only the locations of color filters are adjusted, unlike imaging device.

In this embodiment, the color filter disposed in the peripheral section has a smaller thickness than the thickness of the color filter disposed in the central section. This configuration decreases the difference in optical path length between the light beam L2 (illustrated in FIG. 15A) passing, along a diagonal direction, through a color filter 15A2 in the peripheral section and the light beam L1 (illustrated in FIG. 15B) passing, along a vertical direction, through a color filter 15A1 in the central section.

The above configuration makes it possible to suppress not only a decrease in the amount of light in the peripheral section but also lowering of luminance and a variation in chromaticity, as compared with comparative example 1. FIG. 16 schematically illustrates an image displayed in comparative example 1. FIG. 17 schematically illustrates an image displayed in this embodiment. As illustrated in the drawings, this embodiment provides more uniform in-plane luminance than in-plane luminance in comparative example 1.

In this embodiment, as described above, color filters of the color filter layer 15 which are disposed in the peripheral section within the display region are shifted from the center locations of the corresponding pixels P. This configuration makes it possible to suppress a decrease in the amount of light in the peripheral section within the display region. Moreover, color filters disposed in the peripheral section have smaller thicknesses than thicknesses of color filters disposed in the central section. This configuration makes it possible to decrease the difference in optical path length between the light beams passing through the color filters in the peripheral section and light beams passing through the color filters in the central section, thereby suppressing lowering of luminance and a variation in chromaticity. Consequently, it is possible to improve quality of a display image.

Next, some modifications of the foregoing embodiment will be described. The same or equivalent elements in the following description as those of the embodiment described above are denoted with the same reference numerals, and will not be described.

[Modification 1]

FIGS. 18A to 18D illustrate a method of forming a color filter layer (color filter layer 15B) according to modification 1 in order of processes In the foregoing embodiment, the configuration in which the thickness of the color filter layer 15 varies in a stepwise manner is exemplified. However, the thickness of the color filter layer may vary in a gradual manner as in this modification. Even in this case, the surface on side on which the light emitting devices 10 are located of the second substrate 16 is processed to form a predetermined recess (recess C2). In this way, it is possible to form the color filter layer 15B with a varying thickness.

Specifically, as illustrated in FIG. 18A, first, a photoresist film 123 is formed on the surface of the second substrate 16, and is patterned. Then, as illustrated in FIG. 18B, etching is performed using the photoresist film 123 as a mask to form recesses c1 in a predetermined pattern (including size, number, density, etc.). Subsequently, the photoresist film 123 is removed, and the surface of the second substrate 16 in which the recesses c1 are formed is polished to form a recess c2 (i.e., a curved surface) with a depth varying in a gradual manner, as illustrated in FIG. 18C. In this case, the portions in which the recesses c1 are formed of the second substrate 16 are cut and polished easily. With use of this, the pattern of the recesses c1 is pattern-formed such that the depth of the recess c2 varies in a gradual manner. Following this, as illustrated in FIG. 18D, the color filter layer 15B is formed by coating so as to be flatly embedded in the formed recess c2. A surface on side on which the second substrate 16 is located of the color filter layer 15B conforms to the shape of the recess c2, whereas the opposite surface of the color filter layer 15B is flat. As a result, the color filter layer 15B is formed with a thickness varying or decreasing in a gradual manner from the central section toward the peripheral section.

Instead of the color filter layer 15 in the foregoing embodiment, the color filter layer 15B may be used as in this modification. This configuration also makes it possible to decrease the difference in optical path length between light beams passing through color filters in the central section and light beams passing through color filters in the peripheral section, as with the configuration in the foregoing embodiment. Thus, it is possible for this modification to achieve effects similar to the effect in the foregoing embodiment.

[Modification 2]

FIG. 19 illustrates a cross-sectional configuration of a color filter layer (color filter layer 15C) according to modification 2. In the foregoing embodiment, the second substrate 16 is processed, and the color filter layer is formed on the processed surface. Alternatively, the first substrate 11 may be processed to form a similar recess. Specifically, a recess 11a may be formed in the surface on side on which the light emitting devices 10 are located of the first substrate 11, with a depth varying in a stepwise manner. The light emitting devices 10 are formed in conformity with a shape of the recess 11a. The color filter layer 15C is formed on the light emitting devices 10 so as to planarize the recess 11a.

As described above, the first substrate 11 may be provided with the recess 11a whose depth varies in a stepwise manner. Forming the color filter layer 15C so as to planarize the recess 11a makes it possible to vary (or decrease) a thickness of the color filter layer 15C in a stepwise manner from the central section toward the peripheral section.

Instead of the color filter layer 15 in the foregoing embodiment, the color filter layer 15C may be used as in this modification. This configuration also makes it possible to decrease the difference in optical path length between light beams passing through color filters in the central section and light beams passing through color filters in the peripheral section, as with the configuration in the foregoing embodiment. Thus, it is possible for this modification to achieve effects similar to the effect in the foregoing embodiment.

[Modification 3]

FIG. 20 illustrates a cross-sectional configuration of a color filter layer (color filter layer 15D) according to modification 3. In the foregoing modification 1, the second substrate 16 is processed, and the color filter layer is formed on the processed surface. Alternatively, the first substrate 11 may be processed to form a similar recess. Specifically, a recess c3 may be formed in the surface on side on which the light emitting devices 10 are located of the first substrate 11, with a depth varying in a gradual manner. The light emitting devices 10 are formed in conformity with a shape of the recess c3. The color filter layer 15D is formed on the light emitting devices 10 so as to planarize the recess c3.

As described above, the first substrate 11 may be provided with the recess c3 whose depth varies in a gradual manner. Forming the color filter layer 15D so as to planarize the recess c3 makes it possible to vary (or decrease) a thickness of the color filter layer 15D in a gradual manner from the central section toward the peripheral section.

Instead of the color filter layer 15 in the foregoing embodiment, the color filter layer 15D may be used as in this modification. This configuration also makes it possible to decrease the difference in optical path length between light beams passing through color filters in the central section and light beams passing through color filters in the peripheral section, as with the configuration in the foregoing embodiment. Thus, it is possible for this modification to achieve effects similar to the effect in the foregoing embodiment.

[Modification 4]

FIG. 21 illustrates a cross-sectional configuration of a color filter layer (color filter layer 15E) according to modification 4. In the foregoing embodiment and modifications 1 to 3, a recess is formed in the first substrate 11 or the second substrate 16 in order to vary the thickness of the color filter layer. In this modification, however, the wattability of a surface of a second substrate 16 is controlled. Specifically, a hydrophilic region 161 and a hydrophobic region 162 are formed over the surface of the second substrate 16, for example by a surface treatment or any other treatment. The hydrophobic region 162 is formed so as to surround the hydrophilic region 161. Forming the color filter layer 15E on the second substrate 16 by coating makes it possible to form a curved shape with a thickness varying in a gradual manner from the central section toward the peripheral section by surface tension.

Utilizing the wattability in the above manner makes it possible to vary (or decrease) a thickness of the color filter layer 15E in a gradual manner from the central section toward the peripheral section.

Instead of the color filter layer 15 in the foregoing embodiment, the color filter layer 15E may be used as in this modification. This configuration also makes it possible to decrease the difference in optical path length between light beams passing through color filters in the central section and light beams passing through color filters in the peripheral section, as with the configuration in the foregoing embodiment. Thus, it is possible for this modification to achieve effects similar to the effect in the foregoing embodiment.

Although the present disclosure has been described by referring to the foregoing embodiments and modifications, the present disclosure is not limited to the foregoing embodiments and modifications, and may be modified in a variety of ways. For example, organic EL devices are used as light emitting devices in the embodiment and modifications. Alternatively, any self-luminous devices, such as light emitting diodes, may also be used as the light emitting devices (or display elements).

The materials and thicknesses of the respective layers described in the foregoing embodiment and modifications are illustrative and are not limited to those described above, and any other materials and any other thicknesses may be employed. Moreover, it may not be necessary for the display device to include all layers described above, or the display device may further include any other layer in addition to the layers described above. Further, the effects described in the embodiment and modifications are illustrative and non-limiting. Effects to be achieved by the present disclosure may be effects other than those described above, or may further include other effects in addition to those described above.

It is to be noted that the present disclosure may have the following configurations.

(1) A display device including:
a plurality of pixels arranged in a two-dimensional fashion, each of the pixels including a light emitting device; and
a color filter layer having color filters, the color filters facing the plurality of pixels, each of the color filters corresponding to one of a plurality of colors,
wherein, of a plurality of color filters in the color filter layer, color filters disposed in a peripheral section within a display region are shifted from center locations of corresponding pixels, and have smaller thicknesses than thicknesses of color filters disposed in a central section within the display region.

(2) The display device according to (1), in which the plurality of color filters are configured to be shifted from the center locations of the corresponding pixels by a shift amount increasing with increasing distance from the central section, and to have a thickness decreasing with increasing distance from the central section.

(3) The display device according to (2), in which a thickness of the color filter layer varies in a stepwise manner from the central section toward the peripheral section.

(4) The display device according to (3), further including:
a first substrate including a pixel circuit; and
a second substrate disposed opposite the first substrate with the light emitting devices therebetween,
in which the second substrate has a recess on a side closer to the light emitting devices, a depth of the recess varying in a stepwise manner, and
the color filter layer is formed to be embedded in the recess and planarize the recess.

(5) The display device according to (3), further including:
a first substrate including a pixel circuit; and
a second substrate disposed opposite the first substrate with the light emitting devices therebetween,
in which the first substrate has a recess on side on which to the light emitting devices are located, a depth of the recess varying in a stepwise manner,
the light emitting devices are disposed on the first substrate in conformity with a shape of the recess, and
the color filter layer is formed on the light emitting devices to planarize the recess.

(6) The display device according to (2), in which a thickness of the color filter layer varies in a gradual manner from the central section toward the peripheral section.

(7) The display device according to (6), further including:
a first substrate including a pixel circuit; and
a second substrate disposed opposite the first substrate with the light emitting devices therebetween,
in which the second substrate has a recess on side on which the light emitting devices are located, a depth of the recess varying in a gradual manner, and
the color filter layer is formed to be embedded in the recess and planarize the recess.

(8) The display device according to (6), further including:
a first substrate including a pixel circuit; and
a second substrate disposed opposite the first substrate with the light emitting devices therebetween, in which the first substrate has a recess on side on which the light emitting devices are located, a depth of the recess varying in a gradual manner, the light emitting devices are disposed on the first substrate in conformity with a shape of the recess, and the color filter layer is formed on the light emitting devices to planarize the recess.

(9) The display device according to (6), further including:

a first substrate including a pixel circuit that drives the light emitting devices; and a second substrate disposed opposite the first substrate with the light emitting devices therebetween, in which a surface on side on which the light emitting devices are located of the second substrate includes a hydrophilic region in the central section and a hydrophobic region in the peripheral section.

(10) The display device according to any one of (1) to (9), further including a single lens that faces the plurality of pixels.

(11) A method of manufacturing a display device including:

forming a plurality of pixels arranged in a two-dimensional fashion, each of the pixels including a light emitting device; and forming a color filter layer having color filters, the color filters facing the plurality of pixels, each of the color filters corresponding to one of a plurality of colors, in which, of a plurality of color filters in the color filter layer, color filters disposed in a peripheral section within a display region are shifted from center locations of corresponding pixels, and have smaller thicknesses than thicknesses of color filters disposed in a central section within the display region.

(12) The method of manufacturing the display device according to (11), in which the plurality of color filters are formed to be shifted from the center locations of the corresponding pixels by a shift amount increasing with increasing distance from the central section, and to have a thickness decreasing with increasing distance from the central section.

(13) The method of manufacturing the display device according to (12), in which a thickness of the color filter layer varies in a stepwise manner from the central section toward the peripheral section.

(14) The method of manufacturing the display device according to (13), further including:

forming the light emitting devices on a first substrate that includes a pixel circuit; and forming a recess in a second substrate that is disposed opposite the first substrate with the light emitting devices therebetween, a depth of the recess varying in a stepwise manner, in which the color filter layer is formed to be embedded in the recess and planarize the recess.

(15) The method of manufacturing the display device according to (13), further including:

forming a recess in a first substrate that includes a pixel circuit, a depth of the recess varying in a stepwise manner; and forming the light emitting devices on the first substrate in conformity with a shape of the recess, in which the color filter layer is disposed on the light emitting devices to planarize the recess.

(16) The method of manufacturing the display device according to (12), in which a thickness of the color filter layer varies in a gradual manner from the central section toward the peripheral section.

(17) The method of manufacturing the display device according to (16), further including:

forming the light emitting devices on a first substrate that includes a pixel circuit; and forming a recess in a second substrate that is disposed opposite the first substrate with the light emitting devices therebetween, a depth of the recess varying in a gradual manner, in which the color filter layer is formed to be embedded in the recess and planarize the recess.

(18) The method of manufacturing the display device according to (16), further including:

forming a recess in a first substrate that includes a pixel circuit, a depth of the recess varying in a gradual manner; and forming the light emitting devices on the first substrate in conformity with a shape of the recess, in which the color filter layer is disposed on the light emitting devices to planarize the recess.

(19) The method of manufacturing the display device according to (16), further including:

forming the light emitting devices on a first substrate that includes a pixel circuit; and forming a function layer on a second substrate that is disposed opposite the first substrate with the light emitting devices therebetween, the function layer having a hydrophilic region in the central section and a hydrophobic region in the peripheral section, in which wattability of a surface of the function layer is utilized to form the color filter layer on the function layer.

(20) An electronic apparatus including a display device that includes:

a plurality of pixels arranged in a two-dimensional fashion, each of the pixels including a light emitting device; and a color filter layer having color filters, the color filters facing the plurality of pixels, each of the color filters corresponding to one of a plurality of colors, in which, of a plurality of color filters in the color filter layer, color filters disposed in a peripheral section within a display region are shifted from center locations of corresponding pixels, and have smaller thicknesses than thicknesses of color filters disposed in a central section within the display region.

This application is based upon and claims the benefit of priority of the Japanese Patent Application No. 2015-121320 filed with the Japan Patent Office on Jun. 16, 2015, the entire contents of which are incorporated herein by reference.

It should be understood that those skilled in the art can contemplate various modifications, combinations, sub-combinations, and variations on the basis of design requirements and other factors insofar as they are within the scope of the appended claims or the equivalents thereof.

The invention claimed is:

1. A display device comprising:

first electrodes between a substrate and a light-emitting layer, a central one of the first electrodes is in a central section of the display device and a peripheral one of the first electrodes is in a peripheral section of the display device; and a second electrode between the light-emitting layer and a layer of color filters, a central one of the color filters is in the central section and a peripheral one of the color filters is in the peripheral section, wherein the peripheral one of the color filters has:

a center location that is closer to the central section than a center location for the peripheral one of the first electrodes, and a thickness that is smaller than a thickness of the central one of the color filters.

2. The display device according to claim 1, wherein the light-emitting layer is configured to emit light.

3. The display device according to claim 1, wherein the light-emitting layer is an organic electroluminescence layer.

4. The display device according to claim 1, wherein the central one of the color filters has a center location that is aligned with a center location for the central one of the first electrodes.

5. The display device according to claim 1, wherein the second electrode is between the central one of the color filters and the central one of the first electrodes.

6. The display device according to claim 1, wherein the second electrode is between the peripheral one of the color filters and the peripheral one of the first electrodes.

7. The display device according to claim 1, wherein the layer of the color filters is between the second electrode and a lens.

8. An electronic apparatus comprising:
the display device according to claim 1.

9. A method of manufacturing a display device comprising:
forming first electrodes, the first electrodes are between a substrate and a light-emitting layer; and
forming a second electrode, the second electrode between the light-emitting layer and a layer of color filters,
wherein a central one of the first electrodes is in a central section of the display device and a peripheral one of the first electrodes is in a peripheral section of the display device, a central one of the color filters is in the central section and a peripheral one of the color filters is in the peripheral section,
wherein the peripheral one of the color filters has:
a center location that is closer to the central section than a center location for the peripheral one of the first electrodes, and
a thickness that is smaller than a thickness of the central one of the color filters.

10. The method according to claim 9, wherein the light-emitting layer emits light.

11. The method according to claim 9, wherein the light-emitting layer is an organic electroluminescence layer.

12. The method according to claim 9, wherein the central one of the color filters has a center location that is aligned with a center location for the central one of the first electrodes.

13. The method according to claim 9, wherein the second electrode is between the central one of the color filters and the central one of the first electrodes.

14. The method according to claim 9, wherein the second electrode is between the peripheral one of the color filters and the peripheral one of the first electrodes.

15. The method according to claim 9, wherein the layer of the color filters is between the second electrode and a lens.

* * * * *